United States Patent [19]
Bailey et al.

[11] Patent Number: 5,461,649
[45] Date of Patent: Oct. 24, 1995

[54] METHOD AND APPARATUS FOR MAINTAINING A STATE OF A STATE MACHINE DURING UNSTABLE CLOCK CONDITIONS WITHOUT CLOCK DELAY

[75] Inventors: Robert L. Bailey; Mary B. Johnson, both of San Jose, Calif.

[73] Assignee: Apple Computer Inc., Cupertino, Calif.

[21] Appl. No.: 239,764

[22] Filed: May 9, 1994

[51] Int. Cl.⁶ .................................................. H03K 21/40
[52] U.S. Cl. ........................... 327/28; 327/142; 327/225; 327/200
[58] Field of Search ............................... 307/465, 247.1, 307/272.3; 377/28; 327/200, 142, 225

[56] References Cited

PUBLICATIONS

IBM Tech. Disc. Bul. vol. 30 No. 6. Nov. 1987 "Self–Clearing Status Register", pp. 178–179.

*Primary Examiner*—Margaret R. Wambach
*Attorney, Agent, or Firm*—Blakely, Sokoloff, Taylor & Zafman

[57] ABSTRACT

An apparatus and method for protecting the state of a state machine from an unstable clock signal. The apparatus of one embodiment includes a state register having an input and a first output which provides an output signal corresponding to the state of the state machine and a set or reset input coupled, through a logic circuit, to the first output. The logic circuit is coupled to receive a signal indicating the unstable state of the clock signal. The logic circuit is coupled to receive a signal indicating the unstable state of the clock signal. The logic circuit feeds back the output from the first output to the set or reset input to maintain the state in the state register while the clock signal is unstable. An embodiment of the method comprises storing a state in a state register, receiving a first signal indicating an unstable state of the clock signal and feeding back the output from the state register to the set or reset input while the first signal indicates the unstable clock exits. In an alternative embodiment, the output from the state register is fed back to its input while the first signal indicates the unstable clock exits.

20 Claims, 9 Drawing Sheets

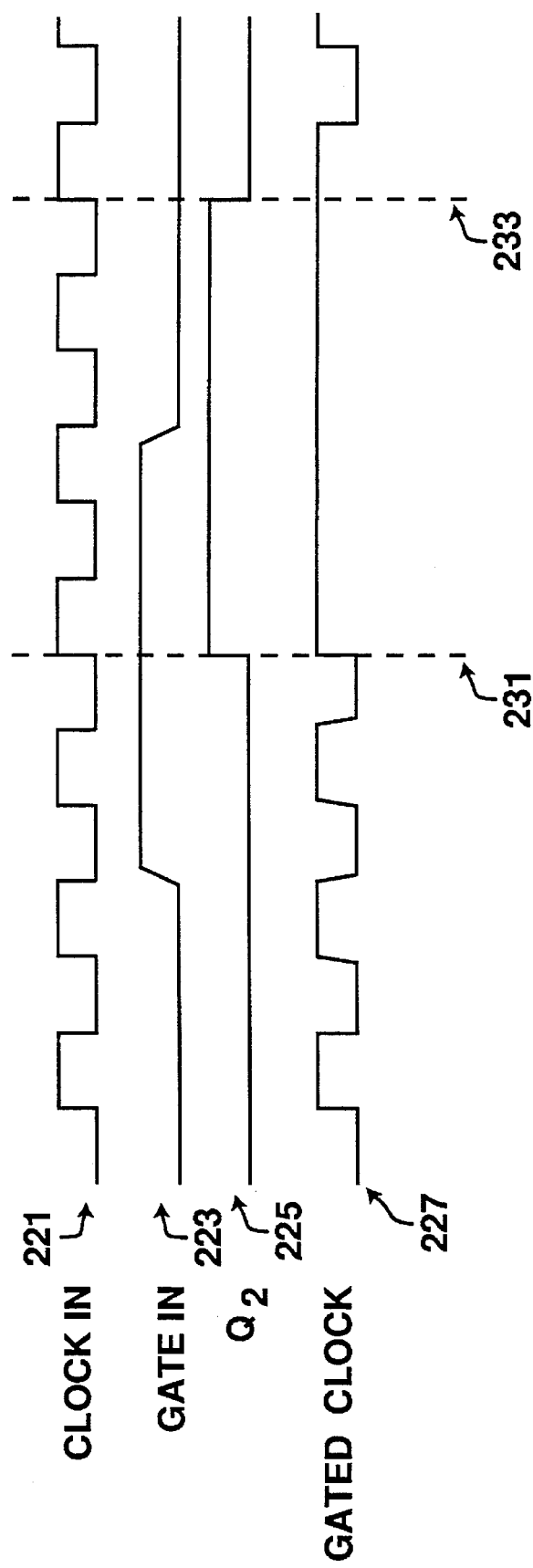

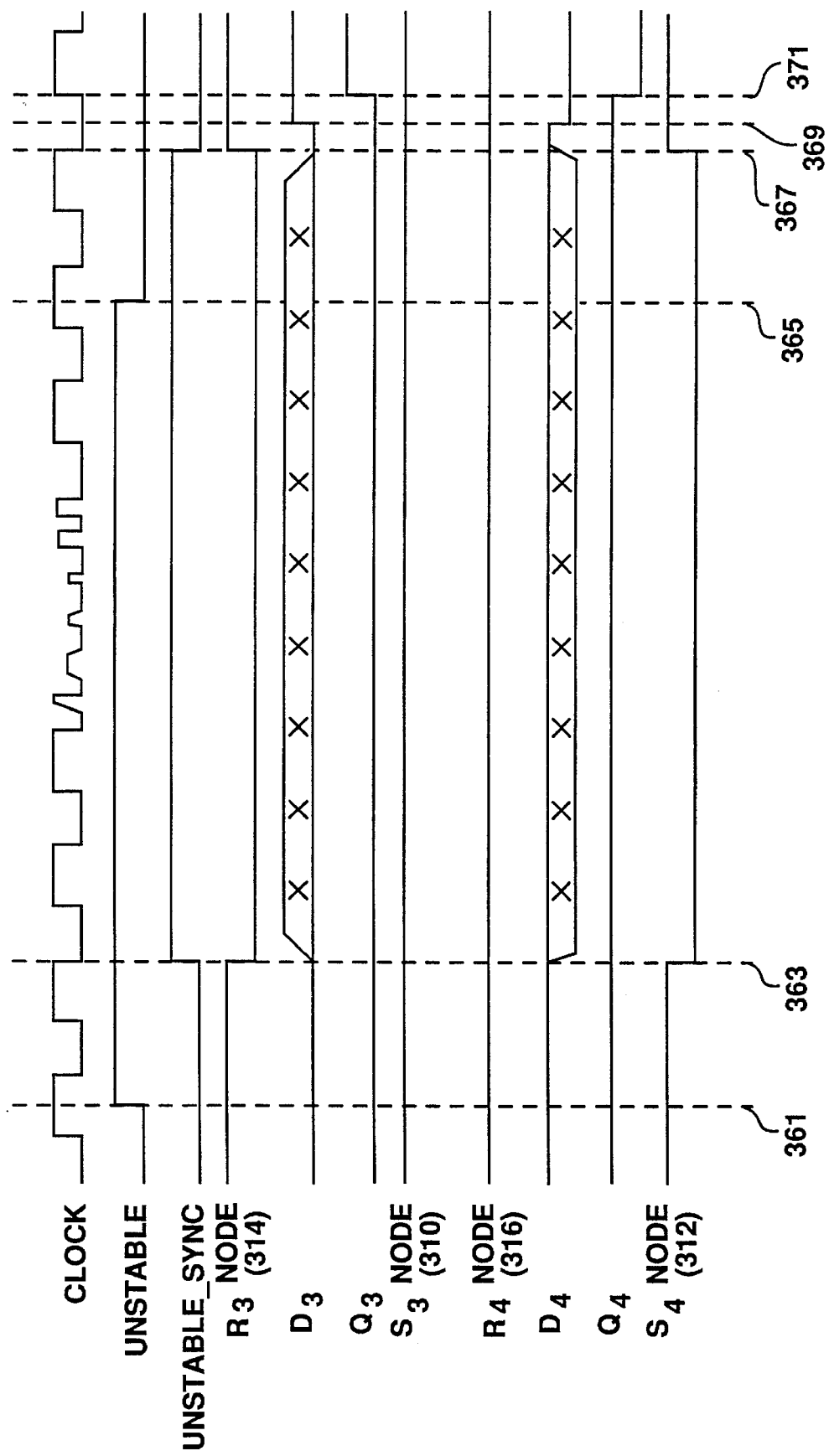

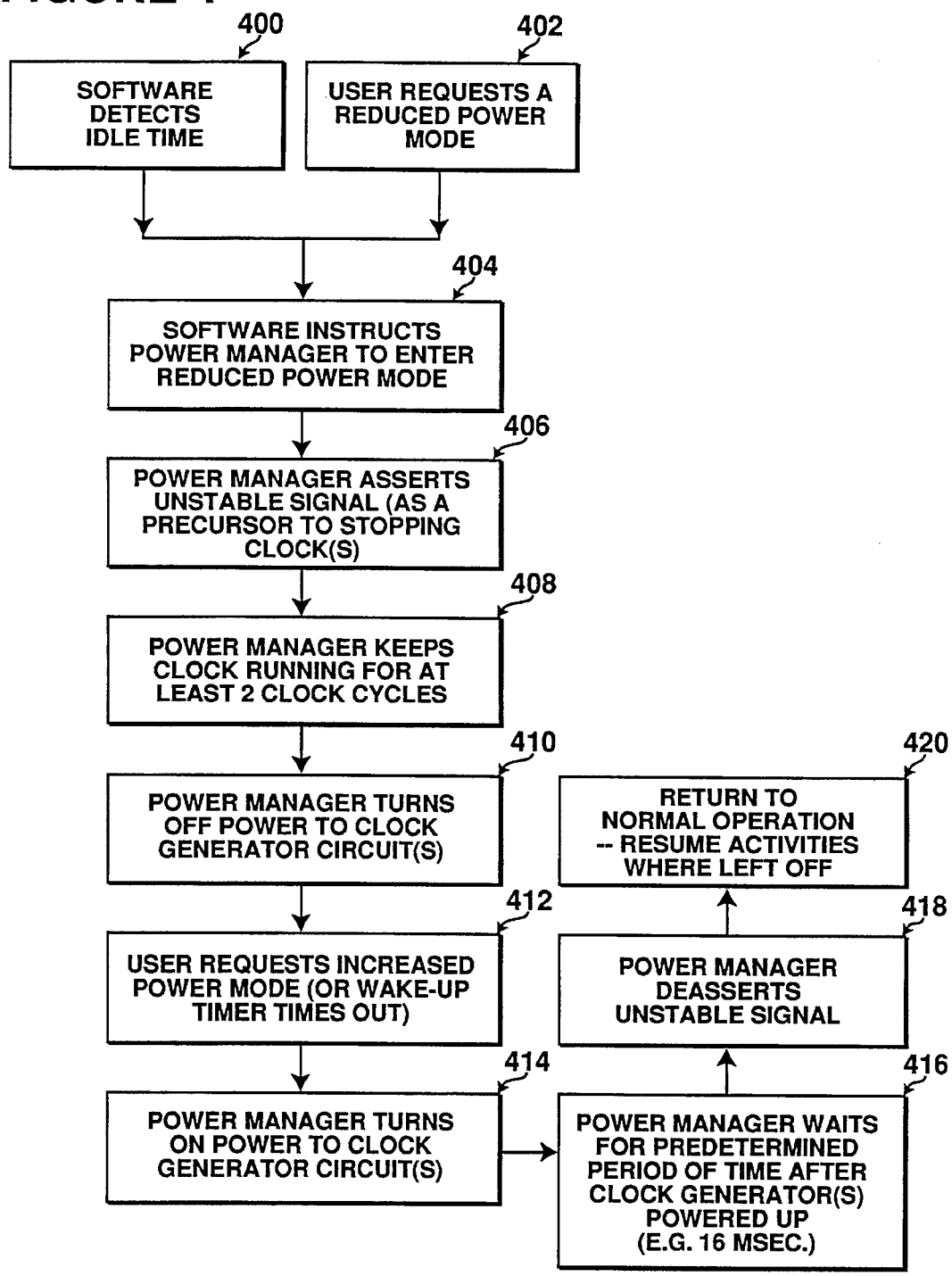

METHOD AND APPARATUS FOR MAINTAINING A STATE OF A STATE MACHINE DURING UNSTABLE CLOCK CONDITIONS WITHOUT CLOCK DELAY

FIELD OF THE INVENTION

The present invention relates to logic devices for maintaining data, and more particularly logic devices, such as state machines for processing information to produce logic states.

BACKGROUND OF THE INVENTION

State machines are widely used in hardware designs to maintain control of systems which have predictable states. State machines are typically clocked; that is, a typical state machine operates under control of a clock, sometimes referred to as a state clock, which provides a periodic clock signal to control synchronous operation of the logic in the state machine.

FIG. 1a shows a typical state machine in block diagram form. The state machine receives certain inputs 11 as well as a clock signal 12 and outputs 15 are provided by the state machine 10. As is well known, the state machine processes the inputs (which may include the prior state of the state machine in the prior clock cycle or cycles). These inputs are processed according to the logic designed into the state machine such that certain outputs are predictably provided as a consequence of the inputs and, in some cases, the poor state of the state machine.

FIG. 1b shows a more detailed example of a typical state machine. It includes some form of logic 17 (such as a PLA and/or random gates and/or random logic) as well as an output register 19 and a state register 21. A clock signal 23 is provided to the state register 21 as well as the output register 19 in order to clock signals into and out of the state register and the output register. It will be appreciated that a plurality of output registers as well as a plurality of state registers may be provided, often in a parallel format, in order to provide a multiple bit state or multiple bit output. The clock signal 23 may also be applied to the logic 17 if the logic is synchronous rather than combinatorial; often, logic 17 is purely combinatorial and thus no clock is required for this logic as long as the clock signal is supplied to the output registers 19 and the state register 21 and as long as normal set up and hold times for these registers are followed. Inputs 33 to the logic 17 are processed by the logic 17 along with, as shown in FIG. 1b the prior state of the state machine which is fed back through line 35 from the state register 21. The processing of the inputs and optionally the prior state through line 35 results in a new output appearing on output 29 as well as a new state appearing on line 25 which are both clocked into the respective registers 19 and 21 to provide new outputs at outputs 31 and 27.

The use of state machines in the prior art to control various logic systems is well known. For example, state machines are often used to control inputs/output (I/O) controllers as well as memory controllers, bus controllers and other controllers which interface between logic systems and subsystems.

In prior art systems where a clock is stable, there is typically no problem with respect to maintenance of the state of state machines and state registers. Even with start up irregularities in a clock system (e.g. a system is powered up for the first time resulting in noise and glitches in the clock signal from the start up process), state machines are usually initialized at some initial condition upon start up such that irregularities in the clock signal from the start up process do not effect the state of a state machine upon initialization.

However, there is often a need to remove power from the clock generating circuits in order to reduce power in a logic system during the operation of the system and to resume operation of the system. A typical example is a laptop computer system (sometimes also referred to as a notebook computer or a portable computer) which is operating off of batteries. Other examples include desktop, notebook, portable or laptop computers which include energy conservation systems designed to conserve energy by reducing power consumption even though the source of power is not a battery (e.g. a conventional AC powered computer); these computers (sometimes referred to as "green" computer systems) reduce power to peripherals (e.g. hard disks, display screens, etc.) in order to reduce power consumption and often also reduce power by reducing power to clock signal generators. In this case, it is advantageous to reduce the power provided to the clock generator circuits by, for example, completely removing power or by slowing the clock down (i.e. decreasing the frequency of the clock signal). It will be appreciated that the bussing of clock signals throughout a computer system causes the consumption of a large amount of power. Thus reducing this power (by reducing the power provided to the clock generating circuits) greatly increases battery life and reduces the power consumption of the laptop computer. It is noted that laptop computers may also use conventional AC power from, for example, a wall outlet, and there is a benefit to reducing its power consumption even in this case.

Reducing power to a clock generator during the operation of a system requires that the clock generator be powered up and powered down while the computer (e.g. a laptop or desktop computer) is being used by a user such that the computer maintains values from its interaction with the user. In other words, this reduction of power occurs in the middle of operating the computer, and the user will expect the computer to preserve the state of the computer's operation when it was caused to enter low power mode, such that upon resuming full power or increased power, the user may continue pending operations. For example, a user of a word processing computer program may have typed a letter which is half completed and is being displayed by the computer system. The user may then perform another task which does not require use of the computer system (e.g. photocopying documents), and the computer system recognizes it is idling and causes itself to enter low power mode. When the user returns to the computer, the user will want the computer to exit low power mode and return, as quickly as possible, to the state it was in when it was last used by the user so that the half-typed letter is again displayed on a display screen of the computer system, and the word processing software is again ready to accept data entry (typing, speech recognition, etc.). Thus, the system RAM may continue to receive power during a lower power mode or the data from the RAM may be copied into a non-volatile memory storage device (e.g. a hard disk) prior to entering low-power mode so that upon resuming normal operations when increased power is applied again, the data prior to reducing power will be available to the user again.

It is of course important to also preserve the states of the various state machines and registers in a computer (e.g. laptop or desktop computer) so that upon resuming normal operation that these states are also preserved for continued use upon resuming normal operation. Unfortunately, reducing power to the clock generator circuits (when entering low power mode) and returning power to the clock generation circuits (when, e.g., resuming normal operation) often causes erratic clock signal pulses which violate the input clock requirements for digital logic, particularly logic assembled in an Application Specific Integrated Circuit (ASIC). As a result, state machines which are often implemented in such ASIC logic can be corrupted into incorrect states from such an erratic clock signal generated from powering down a clock generator or from powering up a clock generator in order to resume activity. As noted above, clock signals tend to be erratic during a normal power up sequence, but then the state machines can be reset to a clean "power up" state by an initialization system. However, in transitioning into and out of low power consumption states in a laptop computer, the computer system is still running and the current state needs to be maintained, and thus resetting to a power on state (initialization) is not acceptable as this will usually not be the state of the computer when low power mode was entered.

FIG. 2a shows an example in the prior art of dealing with this problem of erratic clock signals which occur during power up and power down of clock generation circuits during the continued operation of, for example, laptop computers which are entering and exiting low power consumption modes. In particular, FIG. 2a shows an ASIC chip 200 receiving a clock signal at the clock in input 201 and also receiving a "gate in" signal at input 203. The "gate in" signal is used to maintain the state of clocked registers within the ASIC 200 by not providing the clock internally when the "gate in" signal indicates the clock is unstable (due to entry into or exit from low power mode).

The clock input signal which contains the clock signal is applied to an OR gate 205 as one input of that OR gate 205 and the other input of that OR gate is an output 211 from a flip flop 207, which receives as its input the output of another flip flop 209. The flip flop 209 receives as its input the "gate in" signal, and both flip flops 209 and 207 are clocked under control of the clock in input 201 which receives the clock signal.

FIG. 2b shows a waveform diagram of the various signals used in the prior art approach shown in FIG. 2a. The "gate in" signal is generated whenever the laptop computer or other logic system exits or enters a low power consumption mode. That is, this signal indicates that the clock may become unstable as a result of entering or leaving low power consumption mode in a laptop computer or other logic system. During normal operation the "gate in" signal is maintained low such that the clock in input 201 which contains the clock signal 221 shown in FIG. 2b is provided to the circuits in the ASIC chip 200. When the gate in signal 223 becomes high, this indicates that the computer system is entering a low power consumption mode and that the clock generating circuit will receive reduced power (including perhaps no power) and thus may produce erratic clock pulses at any time during which the clock may be unstable during the low power consumption mode. Thus, a predetermined time after signal 223 (the gate in signal) goes high, the gated clock signal 227 appearing at the output of OR gate 205 no longer reflects the clock signal 221; this can be seen at point 231 in FIG. 2b. At a predetermined time (after the gate in signal 223 becomes low, indicating that normal operation will resume) the gated clock signal 227 resumes providing the normal clock input signal appearing at input 201 of the ASIC 200; this is shown at point 233 of FIG. 2b. This method adds delay to the clock signal which can effect its relationship to other clocks in the system resulting in unpredictable operation. Gating the clock has been acceptable in previous systems because bus speeds are moderate and the clock skew from the delay could be tolerated. Now that system and industry bus speeds have increased, the delay cannot be tolerated.

FIG. 2c shows another attempt in the prior art to maintain stable clock signals. In particular, an ASIC 241 is shown as containing a phase lock loop 243 and a clock driver circuit 245 which outputs a clock signal 247 at the output of the driver 245. The output of this driver is also fed back to the phase lock loop in a conventional manner in order for the phase lock loop to lock onto the clock signal and provide a clock signal internal to the ASIC 241 which reflects the input clock signals at input 201 of the ASIC. In this manner, a stable clock locked to the frequency and phase of the input clock is provided internally to the ASIC 241. It will be appreciated, however, that in this situation the clock input to the phase lock loop at input 201 may not be stopped because this input is a reference input to the phase lock loop 243 and stopping the clock will cause the phase lock loop (PLL) to lose its lock onto the input signal. It will also be appreciated that phase lock loops do not instantly lock onto the phase and frequency of input signals and therefore erratic clock signal outputs from the driver 245 of FIG. 2c will result from stopping the clock to the ASIC or from reducing the power to the clock.

FIG. 2d shows a solution following prior art techniques of the embodiment shown in FIG. 2c. Specifically, a gated clock logic 253 is added between the phase lock loop 243 and the clock driver 245 such that the output from the driver 245 is a gated clock as in the embodiment shown in FIG. 2a. The output from the PLL is fed back as an input to the PLL before the clock signal is gated by logic 253; if the feedback signal to the PLL is from the output of the driver 245, then the PLL will start up with erratic clock signals as noted above. It will be appreciated that the gated clock logic 253 shown in FIG. 2d contains logic which is similar to the two flip flops as well as the OR gate shown in FIG. 2a, where an input to the OR gate is from the output of the phase lock loop 243. The embodiment of FIG. 2d has a similar problem to that of the embodiment of FIG. 2a in that the gating of the clock introduces a delay to the clock signal which becomes a problem at higher frequencies due to the clock skew from the delay. Accordingly, it would be advantageous to provide a method and an apparatus for maintaining the state of state machines while an unstable clock is present without also introducing clock delay as a result of the apparatus and method.

SUMMARY OF THE INVENTION

A method and apparatus for maintaining the state of a state machine or a clocked register during an unstable clock signal condition is disclosed. The method and the apparatus of the present invention provides, in a preferred embodiment, protection for the state machine from an unstable clock signal without introducing clock delay. The apparatus includes a state register having a first input and a first output which provides a first output signal corresponding to the state of the state machine and has at least one of a reset input and a set input which is coupled to the first output. Also included is a logic circuit which is coupled to receive a signal indicating an unstable state of a clock signal and is coupled to one of the reset input and the set input which is also coupled to the first output. The logic circuit feeds back the first output signal to one of the reset input and set input which is also coupled to the first output to maintain the state while the clock signal is in the unstable state.

In an alternative embodiment, the apparatus includes a state register having a first input and a first output as well as a multiplexer. The multiplexer has a select input which is coupled to receive a signal indicating an unstable state of a clock signal and includes a first input and second input, where the first input is coupled to receive an input signal corresponding to the state to be stored into the state register and the second input is coupled to the output of the register to feed back the output from the register back to the multiplexer and to the state register. The output of the multiplexer is coupled to the input of the state register such that the multiplexer feeds back the output from the state register while the clock signal is unstable to maintain the state of the state register and thus of the state machine.

BRIEF DESCRIPTION OF THE DRAWINGS

FIG. 2b shows in waveform format various signals used in the gated clock embodiment of FIG. 2a.

FIG. 3b shows the various signals in waveform format of the signals used in conjunction with the apparatus of FIG. 3a.

FIG. 4 shows a flow chart showing a method according to the present invention.

DETAILED DESCRIPTION OF THE INVENTION

In the following description for purposes of explanation, specific systems, interconnections, gates, signals, and processing steps are set forth in order to provide a thorough understanding of the present invention. However it would appreciated by one skilled in the art that the present invention may be practiced without these specific details disclosed herein. In other instances, well known system and circuits are shown in diagrammatic or block diagram form in order not to obscure the present invention unnecessarily.

Figure 1A:
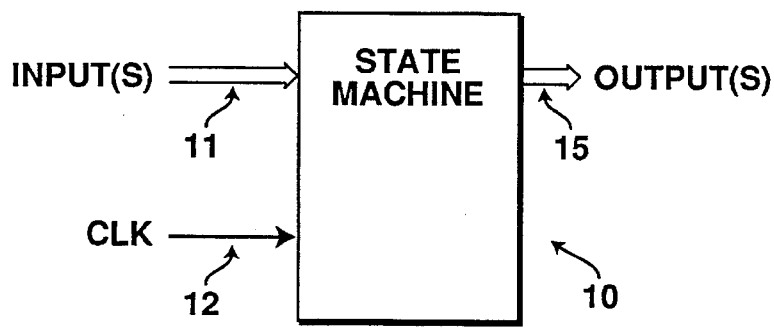
FIG. 1a shows a typical prior art state machine.
Figure 1B:
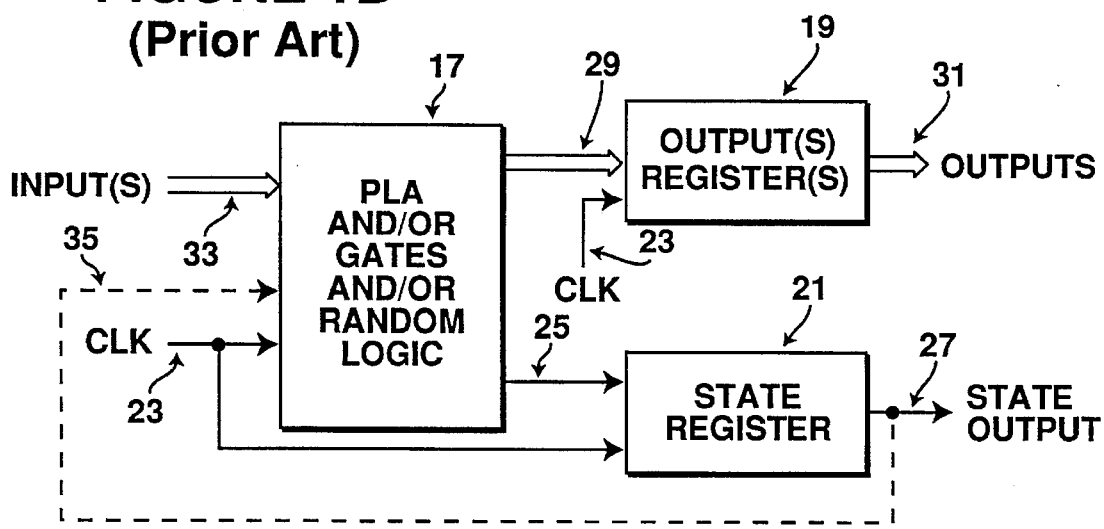
FIG. 1b shows a more detailed example of a prior art state machine.
Figure 1C:
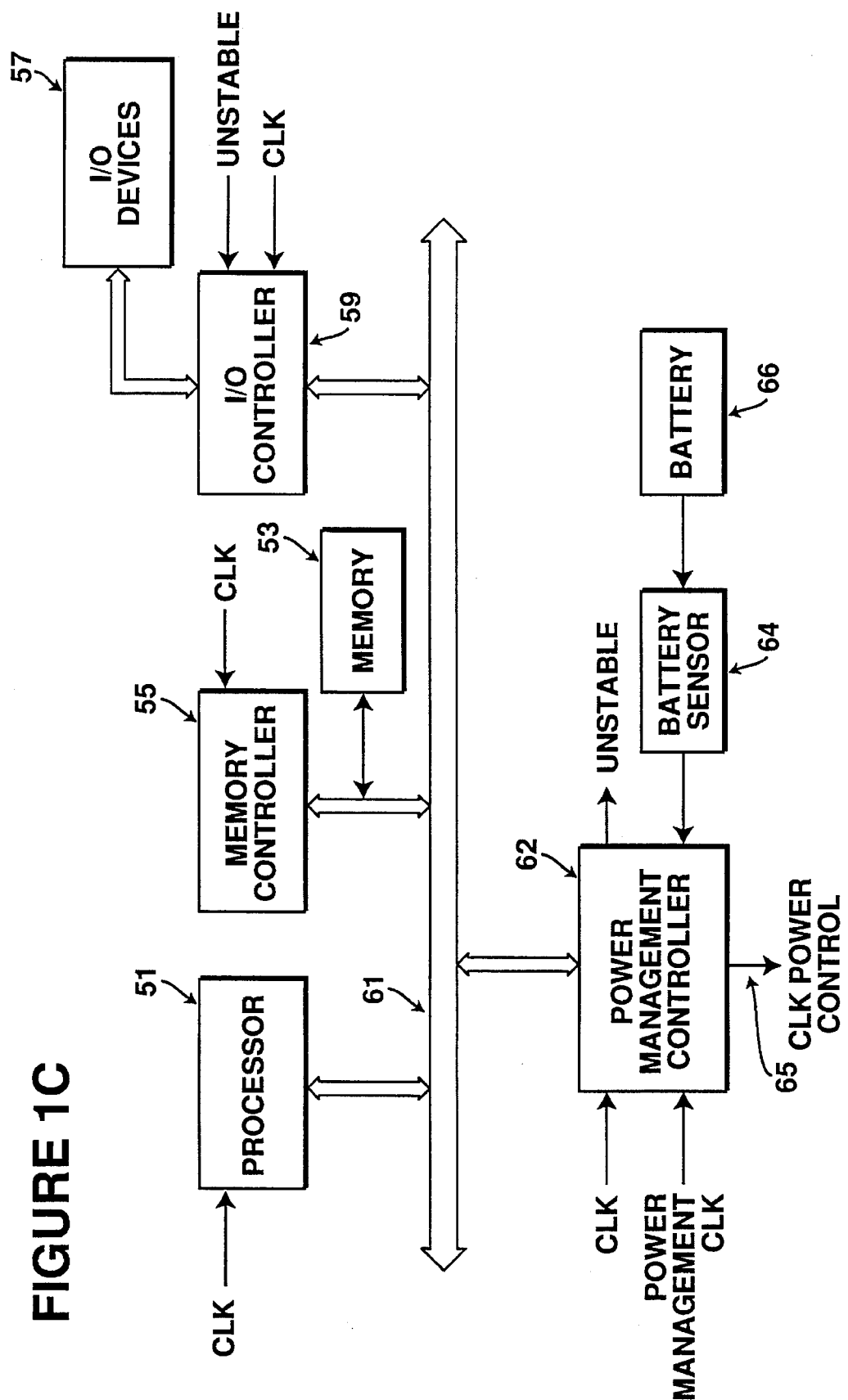
FIG. 1c shows a system according to the present invention which provides for protection of state machines from unstable clock signals.

FIG. 1c shows a typical laptop computer which may incorporate the apparatus of the present invention. The computer may include a processor 51 which is typically a microprocessor which is coupled to receive a clock signal, such as a system clock. The processor 51 is coupled to a bus 61 and to memory 53 which is controlled by a memory controller 55 which also receives a system clock or other clock signal. Similarly, input and output devices, such as keyboards, hard disks, and other well known computer devices are coupled through one or more input/output controllers 59 which receives the clock signal or other clock signals which are often dependent upon or related to the clock signal received by processor 51. The input/output controller 59 and the devices thereby controlled, such as input/output devices 57 are coupled to memory 53 and processor 51 through a bus 61. A power management controller 62 is also coupled to the various components of the computer system through, for example, the bus 61. The power management controller typically receives a power management clock which is often not turned off during low power consumption modes in order for the power management controller to control the operation of the laptop computer system during low power modes. Also, the power management controller 62 receives the clock signal CLK and also receives information from a battery sensor 64 which is monitoring the state of the battery 66 which is providing power to the laptop computer. The power management controller 62 provides an output 65 which controls the power to the clock generating circuits such that the power to these circuits may be reduced by slowing the clock frequency or by turning off the clock generators completely such that no clock signal is generated. The power management controller 62 also provides as an output the UNSTABLE signal which is generated in a manner which is similar to the prior art systems which generate the "gate in" signal which indicates that the clock signal is unstable due to entry into or exit from a low power consumption mode in the computer. It will be appreciated that, except from the generation of the UNSTABLE signal, the laptop computer system shown in FIG. 1c is a typical laptop computer system found in the prior art.

Figure 3A:
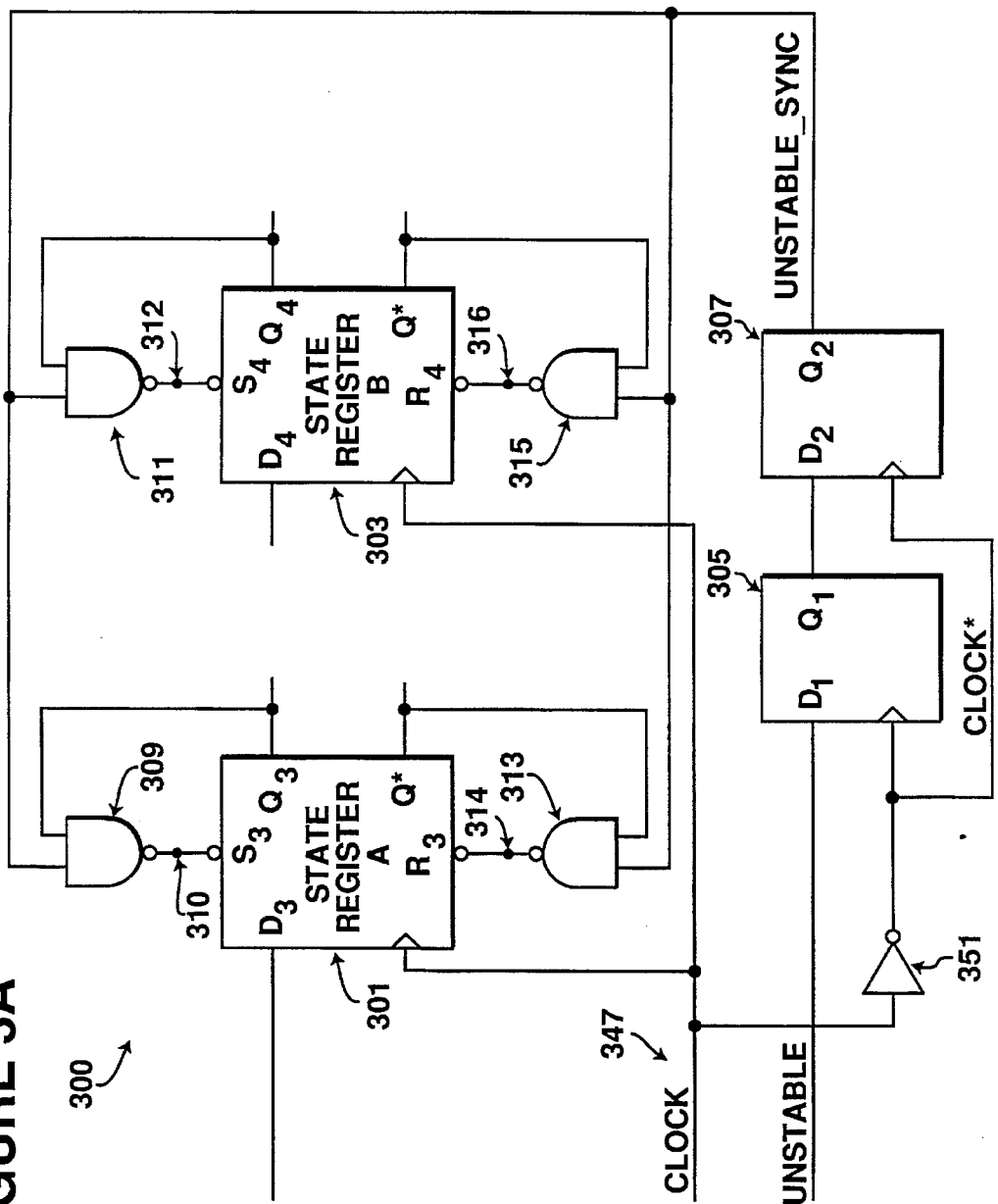
FIG. 3a shows an example of an embodiment according to the present invention.

FIG. 3a shows an particular embodiment of the present invention. The apparatus 300 includes two state registers 301 and 303 as well as two flip flops 305 and 307 and four NAND gates 309, 311, 313, and 315. The state registers 301 and 303 are coupled to receive outputs from a state machine in a conventional manner of the prior art such as state register 21 which receives the output of a state machine through line 25. It will be appreciated that state register 301 may represent a register which is within the state machine logic (e.g. within logic 17 if the state machine's logic is clocked internally, rather than merely combinatorial. Thus, the D3 input of register 301 is coupled to receive the next state to be stored in that register. The outputs of the state register, such as outputs Q3 and Q4 of registers 301 and 303 respectively provide the state outputs which may change during each new clock cycle according to the clock signal input at clock input 347. It will be appreciated that state register 303 and its associated NAND gates 311 and 315 is a duplicate of state register 301, and consequently the following detailed description will be limited to state register 301 and its associated logic circuits provided by NAND gates 309 and 313.

The output Q3 is coupled to one of the inputs of NAND gate 309 and the other input to this NAND gate is coupled to received the UNSTABLE_SYNC signal provided as a result of the UNSTABLE signal which is inputted to flip flop 305. Similarly, the NAND gate 313 has one of its inputs coupled to the Q* output from register 301 which is the logical compliment of the Q3 output of this register. The other input to NAND 313 receives the UNSTABLE_SYNC signal from the output of flip flop 307. In the following description, it is assumed that state registers 301 and 303 are positive edge triggered flip flops, as are flip flops 305 and 307. However, the clock signal input to flip flops 305 and 307 is inverted by inverter 351 such that the UNSTABLE_

SYNC signal has a rising edge at the time that the clock signal at input 347 has a falling edge.

It will be appreciated that when the UNSTABLE_SYNC signal is asserted as shown at point 363 of FIG. 3b, the NAND gates 309 and 313 will feed back the states from their respective outputs to the set and reset inputs of register 301 such that register 301 will maintain its state due to the feedback loop created from the output of the appropriate NAND gate to the set or reset input. This can be seen also from FIG. 3b. The clock signal provided at input 347 is shown at the top of FIG. 3b, and the UNSTABLE signal which is inputted to the flip flop 305 as shown at the second signal, immediately below the clock signal of FIG. 3b. The UNSTABLE_SYNC signal which is outputted by the flip flop 307 is shown immediately below the UNSTABLE signal of FIG. 3b. The signal at node 314 is shown as R3, while the signal at node 310 is shown as S3 in FIG. 3b. That is, the signal at these nodes is shown in order to illustrate the input into the reset and set inputs respectively of register 301. Similarly, the inputs into the reset and set inputs of register 303 are shown at node 316 and at node 312 in FIG. 3b. Certain moments of time are also shown by moments 361, 363, 365, 367, 369 and 371.

The UNSTABLE signal is shown as being asserted at moment 361 which causes, after a predetermined time, the assertion of the UNSTABLE_SYNC signal. The assertion of the UNSTABLE_SYNC signal occurs at moment 363; this predetermined period of time is determined by the number of flip flops used to generate the UNSTABLE_SYNC signal; two such flip flops are shown in FIG. 3a. Once the UNSTABLE_SYNC signal is generated, NAND gate 313, causes node 314 to fall from a logic high to a logic low level so that the output from the Q* output of register 301 is fed back to the reset input R3 to maintain the Q3 output at the low it was in as of moment 363 as shown in FIG. 3b. Similarly, NAND gate 311 at moment 363 causes the output Q4 of register 303 to be fed back to the set input S4 such that node 312 changes from a high logic level to a low logic level at moment 363. Thereafter, during a time in which the UNSTABLE signal remains asserted, the UNSTABLE_SYNC signal will also remain asserted causing the feed back of the output or compliment to be fed back to the set or reset input to cause the state register to maintain its state while the clock signal remains unstable. Furthermore, the D inputs to the registers will be ignored. As noted above, this normally occurs when the user or the computer system on its own initiates a low power consumption mode (e.g. the battery sensor determines that the battery will soon run out of charge). This will be described in further detail with reference to FIG. 4 below. During the low power consumption mode, power to the clock generators may be reduced and erratic clock signal pulses may occur during this time period including the beginning and end of this time.

At some point in time, the computer system or the user will desire to exit the low power consumption mode in order to perform further computer operations. It is at this point that erratic clock pulses can also be generated when the clock generators receive normal power again. The process of resuming normal operation begins at moment 365 when the UNSTABLE signal is deasserted, and at a predetermined period of time later the UNSTABLE_SYNC signal is also deasserted at moment 367. It can be seen at moment 369 that the state registers 301 and 303 have maintained their states such that Q3 remains low as it was at moment 363 and Q4 remains high as it was at moment 363. Thereafter, at moment 371 new data is clocked into the state register as the computer has resumed normal operation and as the clock has resumed its normal operation. It can be seen from FIG. 3b that the clock signal shown at the top of this figure resumes its normal operation at a predetermined period of time before moment 365 such that the clock signal at clock input 347 will stabilize given this predetermined period of time. Otherwise, starting the clock generators immediately upon the deassertion of the UNSTABLE signal or the UNSTABLE_SYNC signal will typically cause the clock generators to provide erratic clock signal pulses which will effect adversely the maintenance of state information in state machines.

Figure 2A:
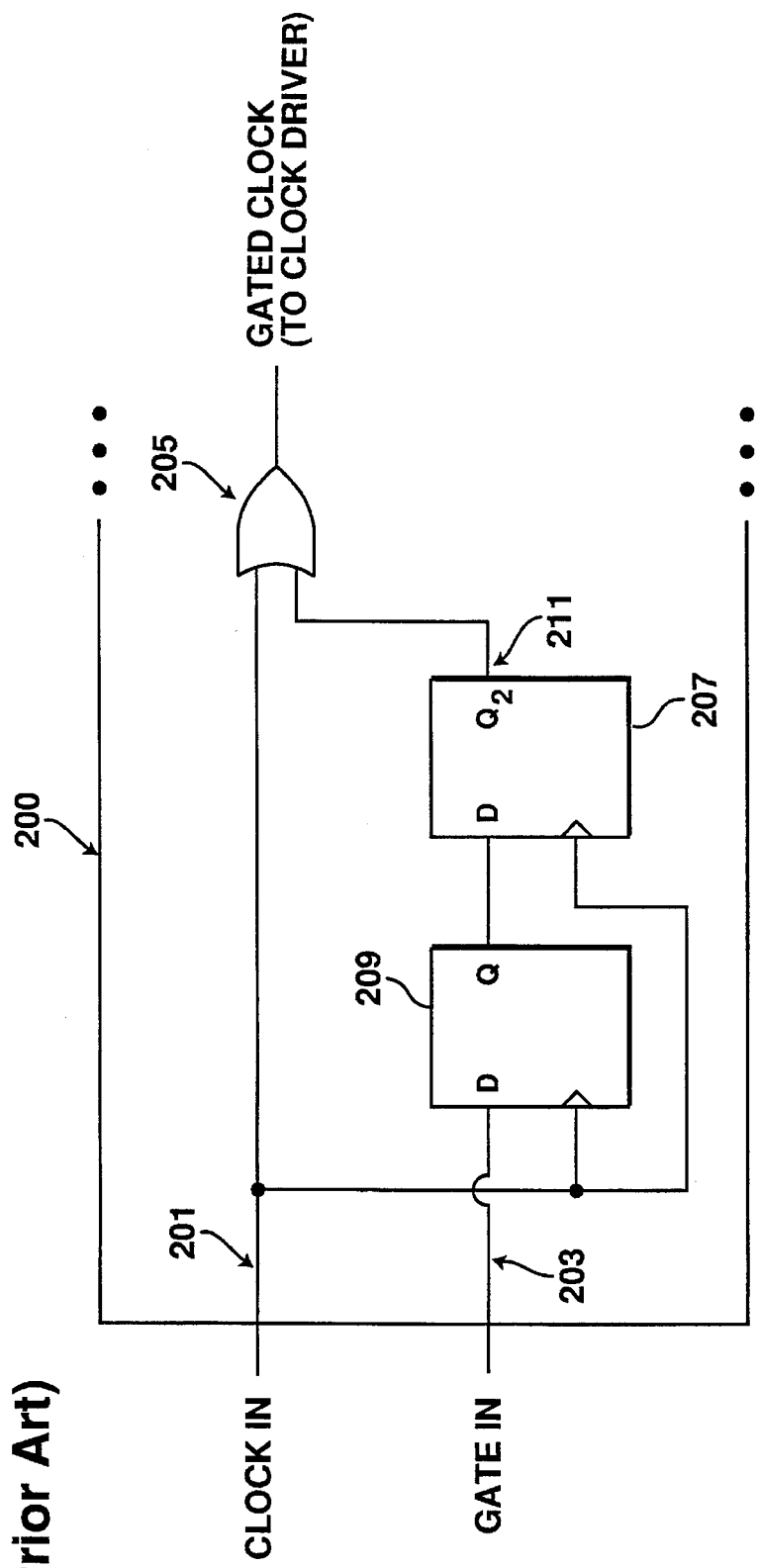
FIG. 2a shows a prior art approach to gating clock signals in order to provide protection to state machines from unstable clock signals.
Figure 2C:
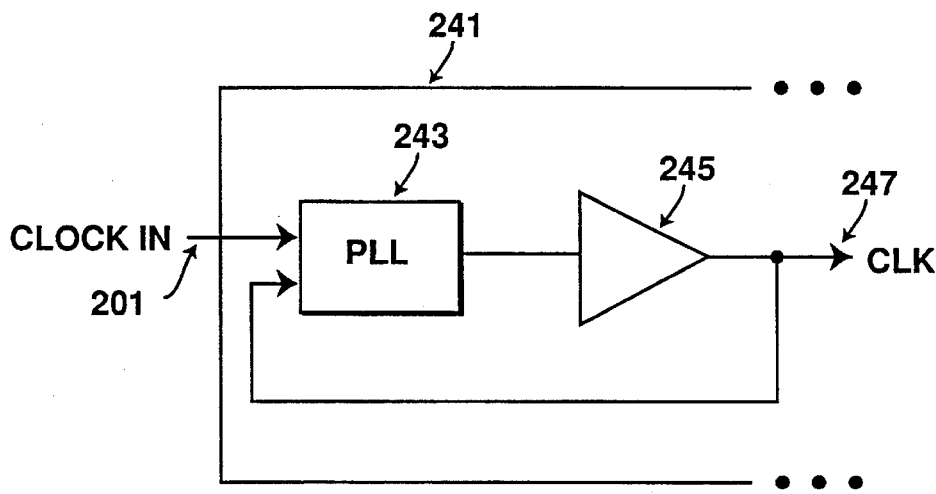
FIG. 2c shows another approach in the prior art for generating a stable clock signal.
Figure 2D:
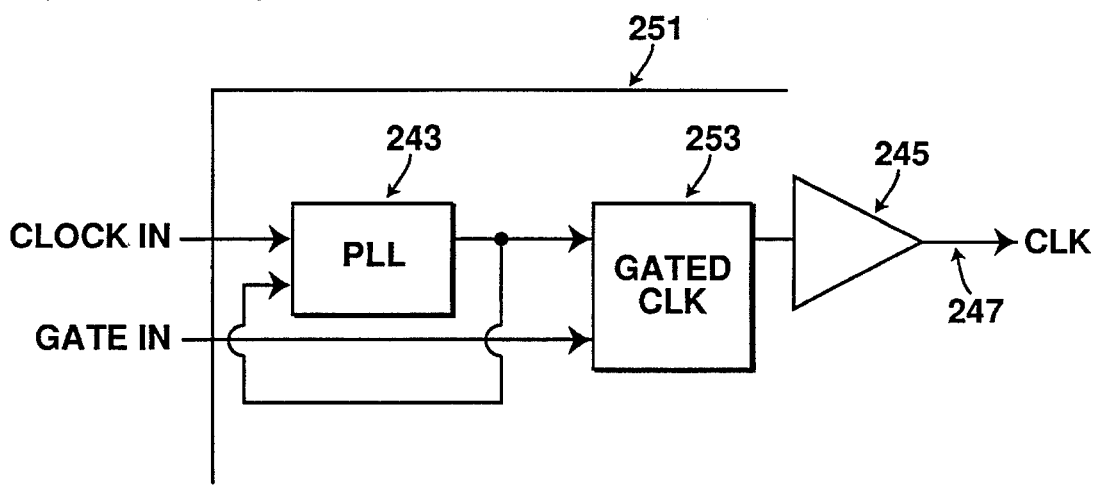
FIG. 2d shows another possible approach in the prior art for generating a stable clock signal using a gated clock with a phase lock loop.

The method of the present invention will now be described by referring to FIG. 4. The method begins in either of step 400 or 402. In step 400, the software of the computer system detects, using conventional techniques, that the computer system is idling without any user interaction or is idling in a manner which the computer recognizes is appropriate to begin entering into low power consumption mode. Alternatively, in step 402 the user may request a reduced power mode by some user specified command as known in the prior art. In step 404, the software of the computer system instructs the power manager to enter reduced power mode; this may be implemented in the conventional approaches of the prior art. In step 406, the power manager asserts the UNSTABLE signal as a precursor to stopping the clock or otherwise reducing power to the clock generator circuits. This UNSTABLE signal is, as noted above, similar to the "gate in" signal generated in the prior art embodiment shown in FIG. 2a.

In step 408, the power manager after an assertion of the UNSTABLE signal keeps the clock generators running at normal power for at least two clock cycles in order for the UNSTABLE_SYNC signal to be generated by the logic shown in FIG. 3a. In step 410, the power manager reduces power to the clock generator circuits in the conventional manner of the prior art by, for example, reducing the frequency of the clock or by removing the power completely from the clock generator circuits or by other methods which are known in the art. At step 412, the user requests an increased power mode which is typically the normal full power operation of the computer; alternatively, a wake-up timer such as those used in the prior art may time out under control of the power management controller and its power management clock. These wake-up timers are known in the art and are typically for allowing the computer system to poll peripheral devices and other systems in order to check the status of the computer system (e.g. to make sure it should remain in the lower power consumption mode). In step 414, the power manager turns on power to the clock generator or otherwise increases power to the clock generator circuit in order to restart the clock signal. In step 416, the power manager waits for a predetermined period of time after the clock generators have been powered up in order to provide time for the clock generators to stabilize and provide a stable clock signal which will be used by the state machines of the present invention. After step 416, the power manager 418 deasserts the UNSTABLE signal and the state machines of the present invention then resume normal operation. At step 420, the computer system is returned to the state it was in prior to entering low power mode since this state is maintained by virtue of maintaining the states of state machines and/or clocked registers in the computer system by using the apparatus and method of the invention. It will be appreciated that other memory devices (e.g. System RAM) will often be preserved in conventional ways (e.g. maintaining power to the RAM or slowing the refresh cycle or copying the data in RAM into a nonvolatile storage device prior to entering low power mode and then copying the data back to the RAM after exiting low power mode). At step 420 the computer user may resume activities with the computer at the point where the user left off. In the example given above, the user may resume typing the letter which was half typed when low power mode was entered.

Figure 5:
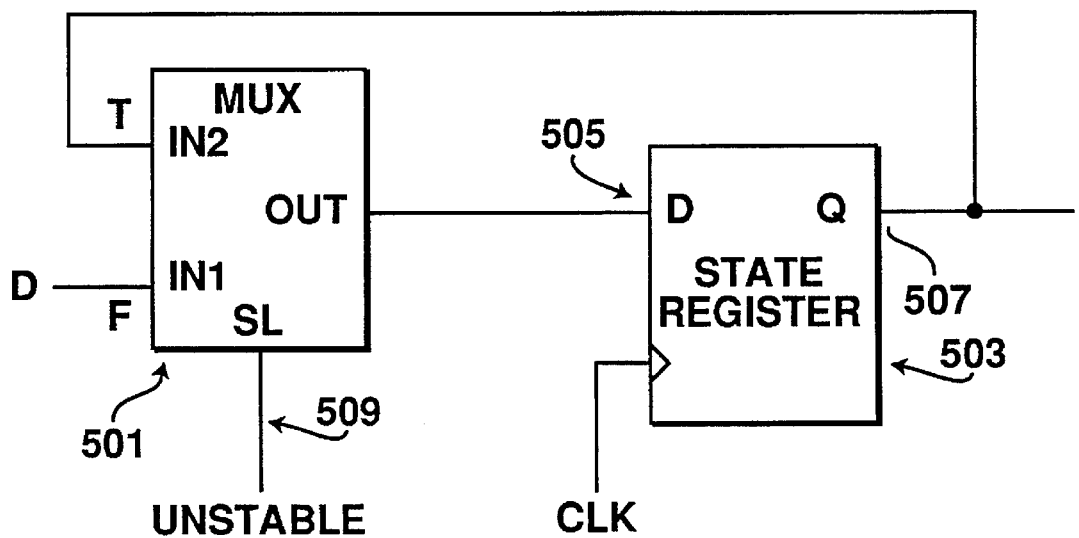
FIG. 5 shows an alternative embodiment of the present invention.

FIG. 5 shows an alternative apparatus of the present invention which utilizes a multiplexer 501 coupled to a state register 503. It will be appreciated that the state register 503 is similar to the state register 21 of the prior art and that it receives a state input at the D input 505 of the register 503 and provides a state output at the Q output of register 503. The state input is applied to the "in 1" input of the multiplexer 501. In normal operation, the select line 509 of the multiplexer 501 receives a "false" signal selecting the "in 1" input such that the D input from the state machine is clocked into the state register 503 through the D input 505. The select line 509 of multiplexer 501 is coupled to receive the UNSTABLE signal or the UNSTABLE_SYNC signal such that the state of the clock signal controls the state of the multiplexer 501. Typically, the UNSTABLE_SYNC signal will be applied to the select line 509. During an unstable clock condition, the select line 509 selects the true input which is input "in 2". This input receives the output from the state register 503 such that the output from the state register is recirculated (fed back) to the D input 505 while the clock signal is unstable thereby maintaining the state of the state register and hence the state of the state machine.

The foregoing invention has been described with reference to numerous examples, circuits, waveforms, and processes. It will be appreciated that these numerous examples and embodiments may be implemented in alternative ways and that the foregoing description is for purposes of illustration only and should not be taken to limit the scope of the following claims.

We claim:

1. An apparatus for maintaining a state during an unstable clock signal condition, said apparatus comprising:

a state register having a first input and an output which provides an output signal indicative of said state, a clock input coupled to receive a clock signal, and at least one of a second input and a third input; and a logic circuit coupled to receive said output signal and a signal indicating an unstable state of said clock signal and coupled to said one of said second input and said third input, said logic circuit feeding back said output signal to said one of said second input and said third input to maintain said state while said clock signal is in said unstable state.

2. An apparatus according to claim 1 wherein said state register output comprises first and second outputs which provide respective complementary first and second output signals indicative of said state, and wherein said logic circuit is coupled to feedback said first output signal to said third input and said second output signal to said second input.

3. An apparatus according to claim 1 wherein said logic circuit is coupled to said second input and said third input and comprises, for each of said second and third inputs, one of an AND gate and a NAND gate to provide a feed back signal while said clock signal is in said unstable state.

4. An apparatus according to claim 3 wherein said logic circuit further comprises at least one flip-flop register coupled to receive said signal indicating an unstable state and coupled to pass an unstable state signal to said one of said AND gate and said NAND gate.

5. An apparatus according to claim 4 wherein said at least one flip-flop register is coupled to receive said clock signal at a clock input thereof to synchronize said unstable state signal with said clock signal.

6. An apparatus for maintaining a state during an unstable clock signal condition, said apparatus comprising:

a state register having a first input and a first output which provides a first output signal corresponding to said state;

a multiplexer having a select input coupled to receive a signal indicating an unstable state of a clock signal and having a first input and a second input and second output, said first input coupled to receive an input signal corresponding to said state, said second input coupled to said first output, and said second output coupled to said first input of said state register, said multiplexer feeding back said first output signal to said first input of said state register to maintain said state while said clock signal is in said unstable state.

7. An apparatus as in claim 6 wherein said state register further comprises a clock input coupled to receive said clock signal.

8. A method for protecting state machine from an unstable clock signal during an unstable clock signal condition, said method comprising:

storing a state in a state register having a first output which provides an output signal and having an input coupled to a state machine, and having a clock input coupled to a clock signal, and having a set input;

receiving a first signal indicating an unstable state of said clock signal;

feeding back said output signal to said set input while said first signal indicates said unstable state.

9. A method as in claim 8 wherein said state register further comprises a reset input and a second output which provides a second output signal corresponding to said state and wherein said set input is coupled to said first output and said reset input is coupled to said second output.

10. A method as in claim 9 wherein said first signal is delayed a first predetermined period of time after a determination has been made that said clock signal will begin said unstable clock signal condition.

11. A method as in claim 10 further comprising receiving a second signal after said first signal, said second signal indicating that said unstable clock signal is ending.

12. A method as in claim 11 further comprising:

reducing power to a clock generator which generates said clock signal, said step of reducing power occurring after said first signal has been received.

13. A method as in claim 12 further comprising:

increasing power to said clock generator.

14. A method as in claim 13 wherein said step of increasing power occurs a predetermined period of time before said second signal is received.

15. A method for protecting state machines from an unstable clock signal during an unstable clock signal condition, said method comprising:

storing a state in a state register having an output which provides an output signal and an input, said input coupled to a state machine, and having a clock input coupled to a clock signal;

receiving a first signal indicating an unstable state of said clock signal:

feeding back said output signal to said input while said first signal indicates said unstable state.

16. A method as in claim 15 wherein said first signal is delayed a first predetermined period of time after a determination has been made that said clock signal will begin said unstable clock signal condition.

17. A method as in claim 16 further comprising receiving a second signal after said first signal, said second signal indicating that said unstable clock signal is ending.

18. A method as in claim 17 further comprising:

reducing power to a clock generator which generates said clock signal, said step of reducing power occurring after said first signal has been received.

19. A method as in claim 18 further comprising:

increasing power to said clock generator.

20. A method as in claim 19 wherein said step of increasing power occurs a predetermined period of time before said second signal is received.

* * * * *